(12) United States Patent
Konishi et al.

(10) Patent No.: US 7,647,694 B2
(45) Date of Patent: Jan. 19, 2010

(54) METHOD FOR MOUNTING ELECTRONIC COMPONENT

(75) Inventors: Misao Konishi, Tochigi (JP); Hidetsugu Namiki, Tochigi (JP); Jyunji Shinozaki, Tochigi (JP)

(73) Assignees: Sony Corporation, Tokyo (JP); Sony Chemical & Information Corporation, Tokyo (JP)

( * ) Notice: Subject to any disclaimer, the term of this patent is extended or adjusted under 35 U.S.C. 154(b) by 269 days.

(21) Appl. No.: 10/560,849

(22) PCT Filed: May 5, 2004

(86) PCT No.: PCT/JP2004/006677

§ 371 (c)(1),
(2), (4) Date: Dec. 15, 2005

(87) PCT Pub. No.: WO2005/027604

PCT Pub. Date: Mar. 24, 2005

(65) Prior Publication Data

US 2007/0094872 A1 May 3, 2007

(30) Foreign Application Priority Data

Sep. 9, 2003 (JP) .............................. 2003-317452

(51) Int. Cl.
*H05K 3/30* (2006.01)
*H05K 3/34* (2006.01)
(52) U.S. Cl. .............................. 29/832; 29/825; 29/840; 29/846

(58) Field of Classification Search .................... 29/825, 29/830, 846, 852, 840, 832
See application file for complete search history.

(56) References Cited

U.S. PATENT DOCUMENTS

| 2003/0170444 A1* | 9/2003 | Stewart et al. | ............ 428/317.7 |
| 2003/0170450 A1* | 9/2003 | Stewart et al. | ............... 428/343 |
| 2005/0218195 A1* | 10/2005 | Wilson et al. | .......... 228/180.22 |

FOREIGN PATENT DOCUMENTS

| JP | 05-343844 | 12/1993 |
| JP | 10-233569 | 9/1998 |
| JP | 11-330162 | 11/1999 |
| JP | 2001-068508 | 3/2001 |
| JP | 2002-141371 | 5/2002 |

* cited by examiner

*Primary Examiner*—C. J Arbes
(74) *Attorney, Agent, or Firm*—Husch Blackwell Sanders Welsh & Katz

(57) ABSTRACT

A method for mounting through an anisotropic conductive film defined as an adhesive sheet an electronic component on a printed circuit board (flexible board) provided with a wiring pattern. The anisotropic conductive film is bonded to an area of the flexible board to be mounted with the electronic component in a state where air intervening between the anisotropic conductive film and the flexible board is heated. Since the air confined between the anisotropic conductive film and the flexible board reduces in volume upon cooled down, occurrence of voids, exposure of the wiring pattern, or the like is avoided. Consequently, reliability can be enhanced without complicating the mounting.

7 Claims, 5 Drawing Sheets

FIG. 4

| 表記 | A | B | C | D | E | F |
|---|---|---|---|---|---|---|
| 外観状態 | | | | | | |
| ボイド割合 | 5％以下 | 10％程度 | 20％程度 | 40％程度 | 60％程度 | 80％以上 |

METHOD FOR MOUNTING ELECTRONIC COMPONENT

BACKGROUND OF THE INVENTION

1. Field of the Invention

This invention relates to a method for mounting through an adhesive sheet an electronic component on a printed circuit board provided with a wiring pattern.

2. Description of Related Art

In implementation of a general COF (Chip on Film) mounting method, an anisotropic conductive film 14 is bonded onto a flexible board 13 formed with wiring patterns 11 corresponding to electronic component terminals and a solder resist 12 formed in a manner to surround an area to be mounted with electronic component and to cover the wiring patterns 11, as shown in FIG. 1A, while an electronic component 16 having bumps 15 is positioned and placed on the anisotropic conductive film 14, thereby being subjected to thermocompression bonding as shown in FIG. 1B. An electronic component mounting module such as shown in FIG. 1C is therefore obtained.

In the meanwhile, in the COF mounting method as described above, air may remain between the anisotropic conductive film 14 and the flexible board 13 due to uneven surface created by the wiring pattern 11, the solder resist 12, and so on as shown in FIG. 1B. When the electronic component 16 is mounted in such a state, such problems may occur that the air trapped between the anisotropic conductive film 14 and the flexible board 13 expands due to heat and pressure added at a mounting time, thereby forming a void 17, or at worst, the void bursts to destroy the anisotropic conductive film 14, thereby resulting in exposure of the wiring pattern 18. The void 17 or exposure 18 of the wiring pattern leads to decrease in reliability of the electronic component mounting module.

Hence, to prevent such problems as described above, a technology has been proposed in which the trapped air is released to an exterior by forming holes in a thickness direction of the flexible board (see, e.g., Patent Literature 1, Japanese Patent Laying-Open No. H05-343844). According to Patent Literature 1, the ventilation holes are formed in a thickness direction in an area to be connected to a flexible circuit board when bonding and uniting an inflexible circuit board to the flexible circuit board through the anisotropic conductive film. With the connecting method according to Patent Literature 1, therefore, even if a bubble (air) remaining at a contact surface between the inflexible circuit board and the flexible circuit board expands due to application of heat, for example, the air bubble diffuses and outgases easily through the ventilation hole in the area to be connected to the flexible circuit board without remaining in the above described area.

However, the above described method according to Patent Literature 1 requires a superfluous process to previously form or process the holes on the flexible board, thereby having such a problem as complicating the mounting operation. Thus, required is development of an art to solve the problem described above with a means different from the method described in Patent Literature 1.

DETAILED DESCRIPTION

This invention has been proposed considering the current condition, and aims to provide a method for mounting an electronic component, with which reliability can be improved without complicating mounting operation.

To achieve the above described object, the method for mounting the electronic component according to this invention, with which the electronic component is mounted through an adhesive sheet to a printed circuit board provided with a wiring pattern, is characterized in that the adhesive sheet is bonded to an area on the printed circuit board to which the electronic component is mounted, in a state where air intervening between the adhesive sheet and the printed circuit board is heated.

With the above described method for mounting the electronic component, the expanded air is trapped between the adhesive sheet and the printed circuit board by rendering the air intervene between the adhesive sheet and the printed circuit board in a process for bonding the adhesive sheet to the printed circuit board. The trapped air is reduced in volume by being cooled. The amount of the trapped air is substantively reduced as described above, thereby solving such problems that the trapped air expands due to application of heat at the time of thermally bonding the electric component and thus causes occurrence of the void or exposure of the wiring pattern.

BRIEF DESCRIPTION OF THE DRAWINGS

FIG. 4 is a table showing appearance conditions and void rate according to evaluation order A to F.

BEST MODE FOR CARRYING OUT THE INVENTION

Figure 1A:
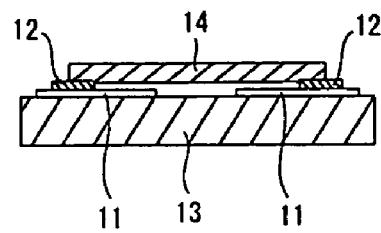
FIG. 1A is a cross-sectional view illustrating a process for bonding an anisotropic conductive film according to a conventional method for mounting an electronic component.
Figure 1B:
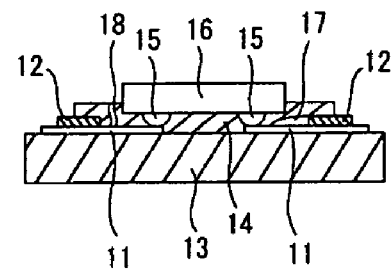
FIG. 1B is a cross-sectional view illustrating a process for mounting the electronic component according to a conventional method for mounting the electronic component.
Figure 1C:
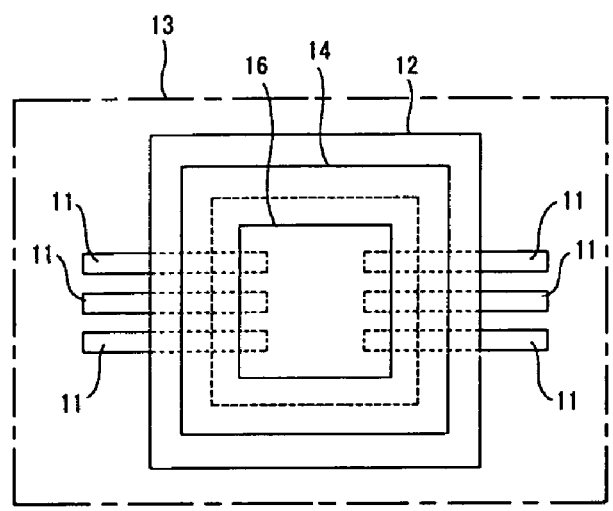
FIG. 1C is a schematic plan view showing an electronic component mounting module according to a conventional method for mounting the electronic component.
Figure 2A:
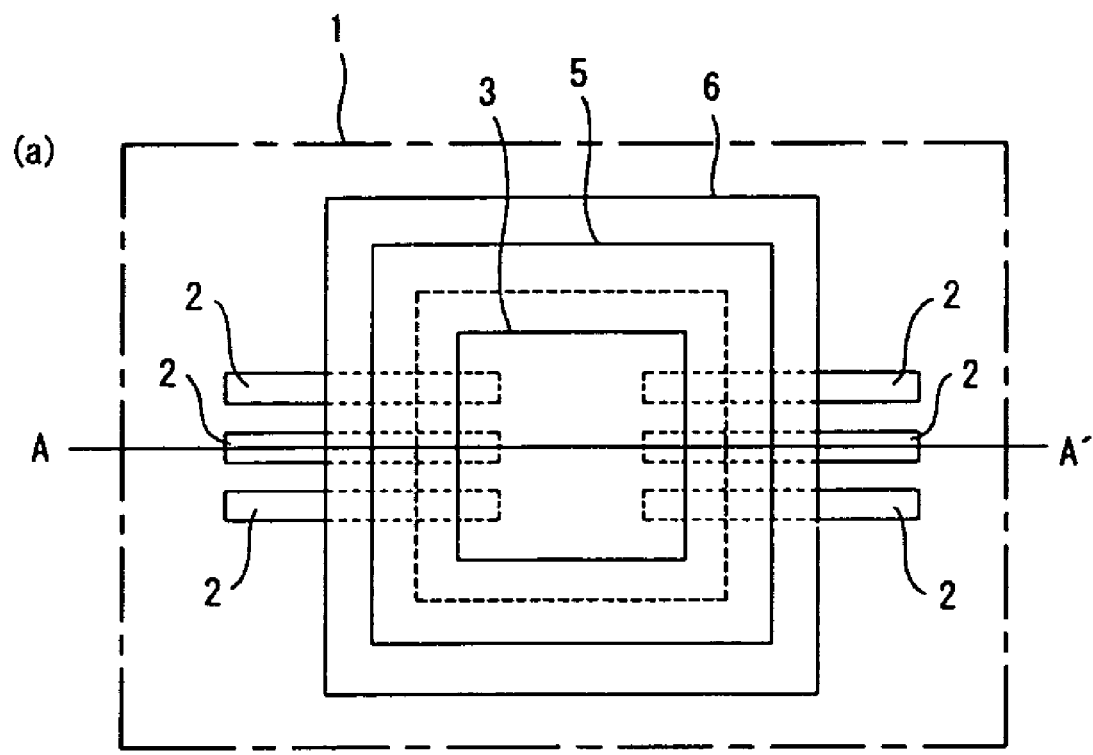
FIG. 2A is a schematic plan view illustrating an example of the electronic component mounting module manufactured according to this invention.
Figure 2B:
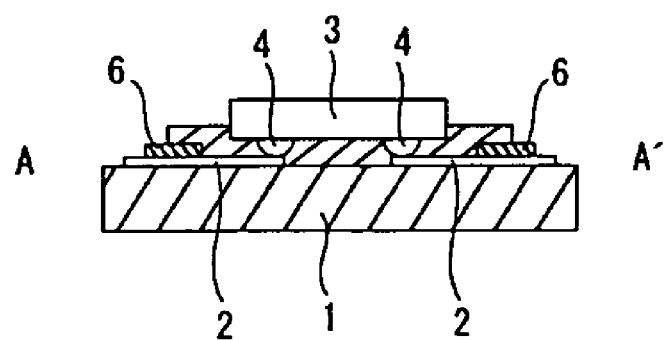
FIG. 2B is a schematic cross-sectional view along a line A-A' in FIG. 2A.

Hereinafter, a method for mounting an electronic component according to this invention is described in reference to drawings. Described first is an electronic component mounting module manufactured according to this invention.

The electronic component mounting module manufactured according to this invention is structured according to a so-called COF (Chip on Film) mounting method with which a plurality of wiring patterns 2 on, e.g., a flexible board 1 defined as a printed circuit board are pressurized to be adhered to bumps 4 of an electronic component 3 through an anisotropic conductive film 5 defined as an adhesive sheet so that the electronic component 3 is loaded on the flexible board 1.

On the flexible board 1, a solder resist 6 for maintaining electrical insulation performance of the mutual wiring patterns 2 as well as for protecting the wiring patterns 2 coats the wiring patterns 2 leaving a portion of the wiring patterns 2 to be in contact with the electronic component 3 exposed. That is, the solder resist 6 has such an opening as surrounding an area to be mounted with the electronic component 3.

The anisotropic conductive film 5, for example, is a film-like adhesive in which conductive particles are dispersed, through which the electronic component 3 and the flexible board 1 are pressurized and adhered to establish an electrical connection. The anisotropic conductive film 5 is rendered to have such an outside dimension as overlapping with an inner circumferential edge of the solder resist 6 and to be bonded onto the solder resist 6 in a manner to cover the area to be mounted with the electronic component 3. It is to be noted that the adhesive sheet is not limited to the above described anisotropic conductive film 5 but may be, for example, a sheet of mere adhesive not containing the conductive particles.

Any components used for the electronic component mounting module of this type can be used as those composing the electronic component mounting module such as the above.

As the flexible board 1, for example, an insulating substrate made of flexible polyimide can be used. The plurality of wiring patterns 2 on the flexible board 1 are made of a conductor such as copper or the like, and formed corresponding to the bumps 4 of the electronic component 3. It is to be noted that the printed circuit board is also not limited to the above described flexible board 1 but may be any type of printed wiring board such as a so-called rigid board or the like.

The electronic component 3 is defined as, for example, an IC chip, i.e., an IC chip such as, e.g., a semiconductor bare chip, or the like, and has a surface with the bumps 4 made of gold or the like, serving as terminals.

As the adhesive composing the anisotropic conductive film 5, various types of thermosetting resin, thermoplastic resin, rubber, or the like can be used. It is especially desirable to use the thermosetting resin from a view point of reliability after connection. Used as the thermosetting resin is a synthetic resin such as an epoxy resin, a melamine resin, a phenol resin, a diallyl phthalate resin, a bismaleimide triazine resin, a polyester resin, a polyurethane resin, a phenoxy resin, a polyamide resin, a polyimide resin, or the like, or rubber or elastomer containing a functional group such as a hydroxyl group, a carboxyl group, a vinyl group, amino group, an epoxy group, or the like. Especially, the epoxy resin can be desirably used for its various properties. As the epoxy resin, a bispphenol type epoxy resin or an epoxy novolac resin, or an epoxy compound in which a molecule contains two or more oxirane groups can be used. It is preferable to use the high purity epoxy resin containing an impurity ion, especially a chlorine ion, of less than or equal to 50 ppm.

Various conductive particles can be used for the anisotropic conductive film 5, such as a metal power made of, e.g., nickel, silver, copper, or alloy of any combination thereof, a conductive particle resulting from a spherical resin particle coated with conductive material and plated with metal, a conductive particle resulting from such good electrical conductors coated with an insulating resin film, which have been conventionally used for anisotropic conductive adhesive. Such conductive particles preferably have particle diameters of 0.2 to 20 μm.

The anisotropic conductive film 5 composed of constituent materials such as above has melt viscosity preferably in a range between $1.0 \times 10^5$ mPa·s and $1.0 \times 10^7$ mPa·s. There is a fear that the anisotropic conductive film 5 cannot produce sufficient effects if its melt viscosity is excessively high.

Furthermore, any solder resists normally used for the electronic component mounting module of this type, such as insulating resist material or the like can be used as the solder resist 6.

Explained next is the electronic component mounting method for manufacturing the electronic component mounting module having the above described structure.

Figure 3A:
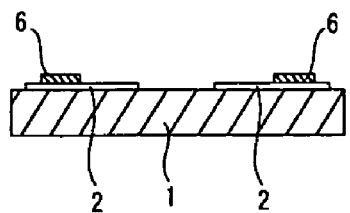
FIG. 3A is a schematic cross-sectional view illustrating a process of a method for mounting the electronic component according to this invention in which a flexible board is manufactured.

For example, a flexible board thoroughly bonded with copper foil is first etched to prepare the flexible board 1 having the plurality of wiring patterns 2 corresponding to the bumps of the electronic component to be mounted. The solder resist 6 is so formed on the flexible board 1 to have an opening for exposing one ends of the wiring patterns 2 to be electrically connected to the bumps 4 of the electronic component 3 and a portion of the flexible board 1 on which the electronic component 3 is mounted, and therefore to surround the area to which the electronic component 3 is mounted. The steps explained above is corresponding to FIG. 3A.

Figure 3B:
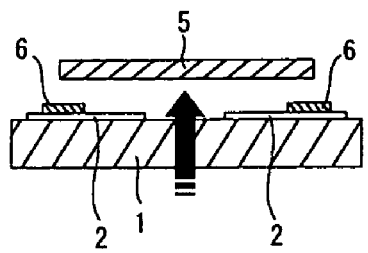
FIG. 3B is a schematic cross-sectional view illustrating a process of a method for mounting the electronic board according to this invention in which air between the flexible board and the anisotropic conductive film is heated.
Figure 3C:
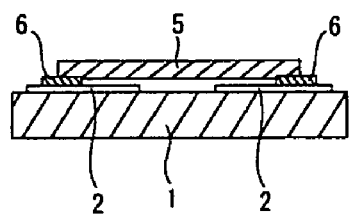
FIG. 3C is a schematic cross-sectional view illustrating a process of a method for mounting the electronic component according to this invention in which the anisotropic conductive film is bonded.

As indicated by an arrow in FIG. 3B, air on the flexible board 1 is next heated by, for example, heating the flexible board 1. As shown in FIG. 3C, the anisotropic conductive film 5 is subsequently bonded, in a state where the heated air intervenes, to the area on the flexible board to which the electronic component is mounted. At that time, the substantive amount of the trapped air can be more reduced as temperature of air is raised higher, however, in a case of using the thermosetting resin as the adhesive for the anisotropic conductive film 5, the temperature of the air is preferably set lower than or equal to the reaction temperature of the anisotropic conductive film 5, such as temperature at which the thermosetting resin hardens. To be more precise, the temperature of air is preferably set higher than or equal to 60 degrees Celsius and more preferably, in a range between 90 and 159 degrees Celsius defined as the reaction temperature of the anisotropic conductive film 5.

Figure 3D:
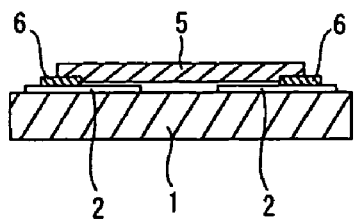
FIG. 3D is a schematic cross-sectional view illustrating a process of a method for mounting the electronic component according to this invention in which the flexible board is cooled down.
Figure 3E:
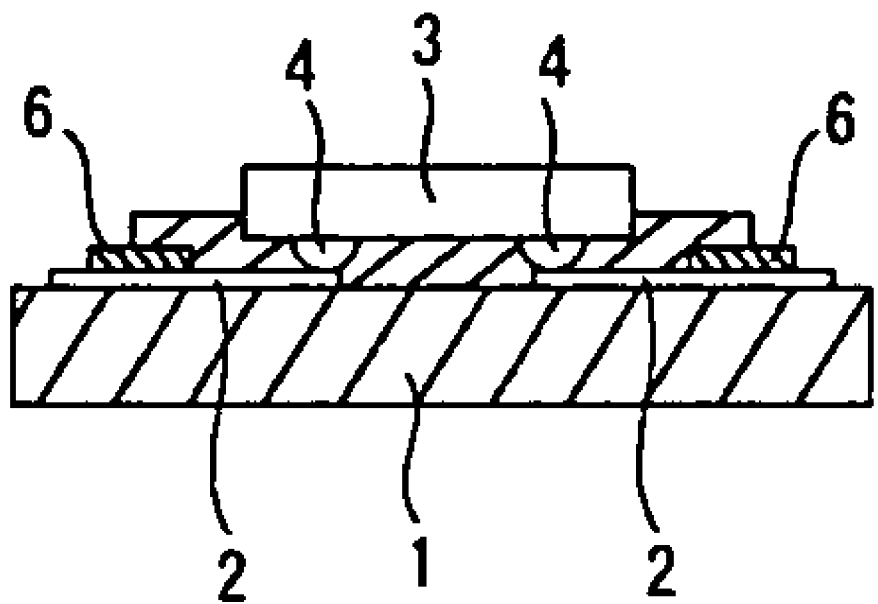
FIG. 3E is a schematic cross-sectional view illustrating a process of a method for mounting the electronic component according to this invention in which the electronic component is mounted.

Next, the flexible board 1 bonded with the anisotropic conductive film 5 is desirably cooled down once. The volume of air trapped below the anisotropic conductive film 5 is, as shown in FIG. 3D, reduced by cooling down the flexible board 1, thereby suppressing occurrence of the voids more certainly.

The electronic component 3 is arranged in place such that a surface of the electronic component 3 on which the bumps 4 are formed faces the anisotropic conductive film 5, and the arranged electronic component 3 is bonded while heating. Therefore, the bumps 4 of the electronic component 3 are electronically connected to the wiring patterns 2 through the conductive particles in the anisotropic conductive film 5, thereby completing the electronic component mounting module as shown in FIG. 3.

In the process of bonding the anisotropic conductive film 5 to the flexible board 1, the air is inevitably trapped in each of concavities and convexities due to the flexible board 1 in a concavo-convex form, however, according to this invention, the air intervening between the anisotropic conductive film 5 and the flexible board 1 is heated to keep the trapped air expanded. That is, the substantive amount of air trapped between the anisotropic conductive film 5 and the flexible board 1 is previously reduced. Therefore, occurrence of the voids, destruction of the anisotropic conductive film 5, or the like due to the trapped air expansion is suppressed even where the air is heated again in the process of thermally bonding the electronic component. Consequently, according to this invention, the electronic component mounting module having reliability can be manufactured, while avoiding drawbacks such as occurrence of voids, exposure of the wiring, or the like associated with the trapped air. Furthermore, the electronic component mounting module having extremely high reliability can be manufactured without a process for forming ventilation holes in the flexible board 1.

EMBODIMENTS

Specific embodiments with application of this invention are explained based on experimental results.

First Embodiment

In this embodiment, the electronic component mounting module was manufactured using the anisotropic conductive films respectively having relatively low flowability (ACF-1: high viscosity), medium flowability (ACF-2: medium viscosity), and high flowability (ACF: low viscosity).

The flexible board provided with wiring patterns was first prepared and formed with the solder resist in a manner to surround the area to be mounted with the IC chip.

The anisotropic conductive film was next heated to raise the temperature of the air on it up to 40 degree Celsius, and then the anisotropic conductive film is adhered onto the flexible board so as to cover the opening of the solder resist. Use d as the anisotropic conductive film herein was the ACF-1 having a melt viscosity (at 100 degrees Celsius) of $2.5 \times 10^7$ mPa·s, according to measurement in using a Haake RS150 rheometer manufactured by HAKKE Co., Ltd. The one or more IC chips were next aligned in place on the anisotropic conductive film and subsequently heated and pressed to be mounted on the flexible board, thereby obtaining the electronic component mounting module.

Furthermore, the electronic component mounting module was manufactured in the same manner except that used as the anisotropic conductive film herein was the ACF-2 having a melt viscosity (at 100 degrees Celsius) of $1.1 \times 10^7$ mPa·s, according to measurement in using the Haake RS150 rheometer manufactured by HAKKE Co., Ltd.

Furthermore, the electronic component mounting module was manufactured in the same manner except that used as the anisotropic conductive film herein was the ACF-3 having a melt viscosity (at 100 degrees Celsius) of $4.0 \times 10^6$ mPa·s, according to measurement in using the Haake RS150 rheometer manufactured by HAKKE Co., Ltd.

Second Embodiment

The electronic component mounting module was manufactured using above described three kinds of anisotropic conductive films in the same manner as in First Embodiment, except that the anisotropic conductive film was bonded so as to cover the opening of the solder resist while the air on the flexible board was heated up to 60 degrees Celsius.

Third Embodiment

The electronic component mounting module was manufactured using above described three kinds of anisotropic conductive films in the same manner as in First Embodiment, except that the anisotropic conductive film was bonded so as to cover the opening of the solder resist while the air on the flexible board was heated up to 80 degrees Celsius.

Fourth Embodiment

The electronic component mounting module was manufactured using above described three kinds of anisotropic conductive films in the same manner as in First Embodiment, except that the anisotropic conductive film was bonded so as to cover the opening of the solder resist while the air on the flexible board was heated up to 120 degrees Celsius.

Comparative Example

In a Comparative Example, the electronic component mounting module was manufactured using the anisotropic conductive films of the same kinds as those in each above embodiment, in the same manner as in the above described embodiments except that the air was not heated through the flexible board in a process for bonding the anisotropic conductive film. It is to be noted that in the Comparative Example, the air between the flexible board and the anisotropic conductive film was at 25 degrees Celsius equal to room temperature.

In regarding each of thus manufactured electronic components, the area mounted with the IC chip was observed from a side of the flexible board to evaluate an occurrence condition of the voids. Evaluation results are described in Table 1. A to F in Table 1 follow the evaluation standard as shown in FIG. 4. That is, A indicates a case of a void rate of less than or equal to 5 percent; B indicates a case of a void rate of about 10 percent; C indicates a case of a void rate of about 20 percent; D indicates a case of a void rate of about 40 percent; E indicates a case of a void rate of about 60 percent; and F indicates a case of a void rate of more than or equal to 80 percent.

TABLE 1

| | Item | | | | |
|---|---|---|---|---|---|
| Heating Temperature | Comparative Example 25degrees C. | First Embodiment 40degrees C. | Second Embodiment 60degrees C. | Third Embodiment 80degrees C. | Fourth Embodiment 120degrees C. |
| ACF-1 | F | F | E | D | B |
| ACF-2 | E | E | D | C | B |
| ACF-3 | C | B | A | A | A |

As is obvious from Table 1, improvement was observed in occurrence of the voids in each of Embodiments in which the air was heated during a process for bonding the anisotropic conductive film, compared to the Comparative Example in which the air was not heated. Especially in Second to Fourth Embodiments in which the air heating temperature is higher than or equal to 60 degrees Celsius, the void rate of less than or equal to 5 percent was achieved in a case of using the anisotropic conductive film ACF-3 and such improvement was obviously observed in using the other anisotropic conductive films ACF-1, ACF-2.

It became clear from the above results that the amount of air trapped between the anisotropic conductive film and the flexible board is decreased upon heating the air in a process for bonding the anisotropic conductive film, thereby being able to suppress the voids from occurring.

As described above in detail, according to the method for mounting the electronic component in this invention, since the amount of air trapped between the adhesive sheet and the printed circuit board can be substantially decreased by heating the air in a process of bonding the adhesive sheet, the electronic component mounting module having high reliability can be manufactured, with which occurrence of voids, exposure of the wiring pattern, or the like is avoided.

Specific embodiments of a method for mounting electronic component according to the present invention have been described for the purpose of illustrating the manner in which the invention may be made and used. It should be understood that implementation of other variations and modifications of the invention and its various aspects will be apparent to those skilled in the art, and that the invention is not limited by the specific embodiments described. It is therefore contemplated to cover by the present invention any and all modifications, variations, or equivalents that fall within the true spirit and scope of the basic underlying principles disclosed and claimed herein.

What is claimed is:

1. A method for mounting through an adhesive sheet an electronic component on a printed circuit board provided with a wiring pattern said printed circuit board having bumps and said wiring pattern covering said bumps to form an uneven surface, the method comprising the steps of:
    placing the adhesive sheet on the wiring pattern so as to leave said uneven surface causing intervening air between the adhesive sheet and the printed circuit board;
    heating the intervening air between the adhesive sheet and the printed circuit board; and
    bonding, while heating the air, the adhesive sheet to cover an area of the printed circuit board to be mounted with the electronic component.

2. The method according to claim 1, wherein the air intervening between the adhesive sheet and the printed circuit board is heated upon heating the printed circuit board.

3. The method according to claim 2, wherein the electronic component is pressurized and bonded on to the adhesive sheet after the printed circuit board bonded with the adhesive sheet is cooled.

4. The method for mounting the electronic component according to claim 1, wherein temperature of the heating process is set to a range between equal to or higher than 60 degrees Celsius and equal to or lower than a reaction temperature of the adhesive sheet.

5. The method for mounting the electronic component according to claim 1, wherein the adhesive sheet is made of an anisotropic conductive film.

6. The method for mounting the electronic component according to claim 1, wherein the printed circuit board is made of a flexible board.

7. The method of claim 1, further including the step of adhering the electronic component with pressure on the adhesive sheet upon reducing an amount of intervening air.

* * * * *